(12) United States Patent
Kim et al.

(10) Patent No.: US 7,705,636 B2
(45) Date of Patent: Apr. 27, 2010

(54) BUFFER CIRCUIT WHICH OCCUPIES LESS AREA IN A SEMICONDUCTOR DEVICE

(75) Inventors: Je Yoon Kim, Gyeonggi-do (KR); Jong Chern Lee, Chungcheongbuk-do (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 22 days.

(21) Appl. No.: 11/964,243

(22) Filed: Dec. 26, 2007

(65) Prior Publication Data

US 2009/0066371 A1 Mar. 12, 2009

(30) Foreign Application Priority Data

Sep. 10, 2007 (KR) ...................... 10-2007-0091786

(51) Int. Cl.
*H03B 1/00* (2006.01)
(52) U.S. Cl. ............................. 327/108; 327/77; 327/82
(58) Field of Classification Search ................. 327/170, 327/108–112, 389, 391, 77, 80–82, 89; 326/82, 326/83, 22–27; 365/230.06; 330/252–255, 330/257
See application file for complete search history.

(56) References Cited

U.S. PATENT DOCUMENTS 6,696,859 B2 * 2/2004 Yagishita et al. ............... 326/82
2006/0197574 A1 * 9/2006 Naviasky et al. ............ 327/307

FOREIGN PATENT DOCUMENTS

KR 2000-0061624 A 10/2000

* cited by examiner

*Primary Examiner*—Long Nguyen
*Assistant Examiner*—Sibin Chen
(74) *Attorney, Agent, or Firm*—Ladas & Parry LLP

(57) ABSTRACT

The present invention relates to a buffer circuit of a semiconductor memory device, and includes a common bias supply unit and a plurality of interface units having a differential amplifying structure. Each interface unit receives an input signal and differentially amplifies the input signal and a common bias. The common bias supply unit is driven by a reference voltage to provide the common bias signal to each of the interface units. The buffer circuit makes it possible to reduce the area occupied by the buffer circuit in a semiconductor memory device.

16 Claims, 6 Drawing Sheets

BUFFER CIRCUIT WHICH OCCUPIES LESS AREA IN A SEMICONDUCTOR DEVICE

CROSS-REFERENCE TO RELATED APPLICATIONS

The present application claims priority to Korean patent application number 10-2007-0091786 filed on Sep. 10, 2007, which is incorporated herein by reference in its entirety.

BACKGROUND OF THE INVENTION

The present invention relates to a buffer circuit, and more precisely to a buffer circuit provided in a semiconductor memory device.

In general, a buffer is provided in the semiconductor memory device for the purpose of making a precise signal interface between an internal portion and an external portion of the semiconductor memory device. Further, if the semiconductor memory device interfaces the signal under conditions that are different from the conditions of the external portion, the buffer is responsible for mitigating the impacts caused by the differing conditions.

FIG. 1 shows a conventional buffer that is formed with a current mirror type differential amplifying structure that compares an input signal IN to the level of a predetermined reference voltage VREF and that outputs the compared results as an output signal OUT.

More specifically, the conventional buffer includes a differential amplifying unit 10 that compares a potential difference between the input signal IN and a bias signal BIAS and outputs it as the output signal OUT, a bias supply unit 12 that is driven by a reference voltage VREF so as to provide the bias signal BIAS to the differential amplifying unit 10, and a load 14 that provides the same pull-down current to a common node of the differential amplifying unit 10 and the bias supply unit 20.

In the conventional buffer, if the input signal IN is input at a level that is relatively higher than the level of the reference voltage VREF, the potential of node O_ND1 descends to allow the output signal OUT to be output at a high level, whereas if the input signal IN is input at a level that is relatively lower than the level of the reference voltage VREF, the potential of the node O_ND1 ascends to allow the output signal OUT to be output at a low level.

A plurality of buffers is provided, each corresponding to a pad of the semiconductor memory device, and multiple buffers having the properties mentioned above are included in the plurality of buffers.

However, since the buffers are provided for each pad of the semiconductor memory device, a problem occurs in that the size of the memory chip increases due to the number of the buffers. Additionally, a circuit (i.e., a reference voltage generating circuit) that controls the buffer is needed for each of the respective buffers, thus further increasing the size of the memory chip.

SUMMARY OF THE INVENTION

The present invention provides a buffer circuit corresponding to a plurality of pads that occupies less area in the semiconductor memory device.

According to one aspect of the present invention, there is provided a buffer circuit comprising a plurality of interface units each having a differential amplifying structure and each having a corresponding input signal, wherein each interface unit compares the respective input signal with a common bias that is common for each of the interface units, and wherein each interface unit outputs an output signal corresponding to the comparison result; and a common bias supply unit which is driven by a reference voltage to provide the common bias signal to each of the interface units.

Preferably, each interface unit forms a current mirror with the common bias supply unit.

Further, the common bias supply unit preferably comprises a bias signal generating unit which performs a pull-up operation of the common bias signal and a pull-down operation of the common bias signal according to a level of the reference voltage to generate the common bias signal; and a bias stabilizing unit which performs the pull-up operation of the common bias signal and the pull-down operation of the common bias signal according to a level of the common bias signal to allow a state of the common bias signal to remain in a uniform state.

Further, the bias signal generating unit preferably comprises a pull-up transistor which selectively pulls up the common bias signal in accordance with the level of the reference voltage; and a pull-down transistor which selectively pulls down the common bias signal in accordance with the level of the reference voltage.

Further, the bias stabilizing unit preferably comprises a pull-up transistor which selectively pulls up the common bias signal in accordance with the level of the common bias signal; and a pull-down transistor which selectively pulls down the common bias signal in accordance with the level of the common bias signal.

Meanwhile, the common bias supply unit further comprises a load providing a same pull-down current for the pull-down operation of the bias signal generating unit and the pull-down operation of the bias stabilizing unit.

Further, the common bias supply unit preferably comprises a capacitor which is connected between a node to which the common bias signal is output and a ground terminal for protecting the buffer circuit from a noise occurring in the reference voltage.

Further, the common bias supply unit preferably comprises a bias control unit which controls strength of at least one of the pull-up operation and the pull-down operation to control the level of the common bias signal.

In addition, the bias control unit comprises at least one of a sub-pull-up driver which controls the pull-up strength of the pull-up operation; and a sub-pull-down driver which controls the pull-down strength of the pull-down operation.

Preferably, the sub-pull-up driver comprises a fuse, and the sub-pull-up operation is selectively performed in accordance with whether or not the fuse is cut.

Further, the sub-pull-up driver selectively performs the sub-pull-up operation in accordance with a state of a test signal that is input when the buffer circuit is in a test mode.

Still further preferably, the sub-pull-down driver comprises a fuse, and the sub-pull-down operation is selectively performed in accordance with whether or not the fuse is cut.

Further, the sub-pull-down driver selectively performs the sub-pull-down operation in accordance with a test signal that is input when the buffer circuit is in a test mode.

In addition, the each interface unit comprises a first driver which performs a pull-up operation and a pull-down operation of the output signal of the interface unit according to a level of the input signal to control a level of an output signal; and a second driver which performs the pull-up operation and the pull-down operation according to a level of the common bias signal to control the level of the output signal.

Preferably, the first driving unit comprises a pull-up transistor which selectively pulls up the output signal in accordance with the level of the input signal; and a pull-down transistor which selectively pulls down the output signal in accordance with the level of the input signal.

Further, the second driving unit preferably comprises a pull-up transistor which selectively pulls up the output signal in accordance with the level of the common bias signal; and a pull-down transistor which selectively pulls down the output signal in accordance with the level of the common bias signal.

A buffer circuit according to another aspect of the present invention comprises a plurality of pads each having an input signal; a plurality of interface units, each interface unit having a differential amplifying structure, and each interface unit receiving the input signal from a corresponding pad among the plurality of pads, wherein the interface unit compares the respective input signal with a common bias signal that is common for each of the interface units, and wherein each interface unit outputs an output signal corresponding to the comparison; a common bias supply unit which is driven by a reference voltage to provide the common bias signal to each of the interface units; a noise protecting unit connected to an output terminal of the common bias supply unit to protect the buffer circuit from any noise in the common bias signal; a sub-pull-up driving unit which controls a level of the common bias signal in addition to a pull-up operation of the common bias supply unit by selectively pulling up the level of the output terminal of the common bias supply unit; and a sub-pull-down driving unit which controls the level of the common bias signal in addition to a pull-down operation of the common bias supply unit by selectively pulling down the level of the output terminal of the common bias supply unit.

Preferably, the each interface unit forms a current mirror with the common bias supply unit.

Further, the common bias supply unit preferably comprises a bias signal generating unit which performs the pull-up operation and the pull-down operation according to a level of the reference voltage to generate the common bias signal; and a bias stabilizing unit which performs the pull-up operation and the pull-down operation according to a level of the common bias signal to allow a state of the common bias signal to remain in a uniform state.

Further, the noise protecting unit preferably comprises a capacitor connected between an output terminal of the common bias supply unit and a ground terminal.

Further, the pull-up operation of the sub-pull-up driving unit and the pull down operation of the sub-pull-down driving unit are selectively performed in accordance with whether or not the fuse is cut or in accordance with a state of the test signal that is input when the buffer circuit is in a test mode.

Since the buffer circuit according to the present invention is structured such that one common bias supply unit is shared by a plurality of interface units having same property, there is an advantage in that the area occupied by the buffer within the semiconductor memory device can be reduced.

Further, the buffer circuit needs only one circuit controlling the buffer circuit, such as a reference voltage generating circuit, since the common bias supply unit is shared, making it possible to further reduce the area.

Further, since the buffer circuit is structured such that a capacitor is connected with the common bias supply unit, it is possible to protect the buffer circuit from any noise in the common bias signal using the capacitor.

Further, since the buffer circuit of the present invention is structured such that the common bias supply unit is connected with a bias control unit controlling a level of the common bias signal, it is possible to efficiently control the properties of a plurality of interface units.

DESCRIPTION OF SPECIFIC EMBODIMENTS

Hereinafter, preferred embodiments of the present invention will be described in detail with reference to the accompanying drawings.

The present invention discloses a buffer circuit in which interface units outputting an output signal in response to an input signal are provided to correspond to each of the pads in a semiconductor device, and a common bias supply unit, which uses a reference signal to provides a common bias signal that controls the bias of the input signal, is shared by the interface units.

Figure 1:
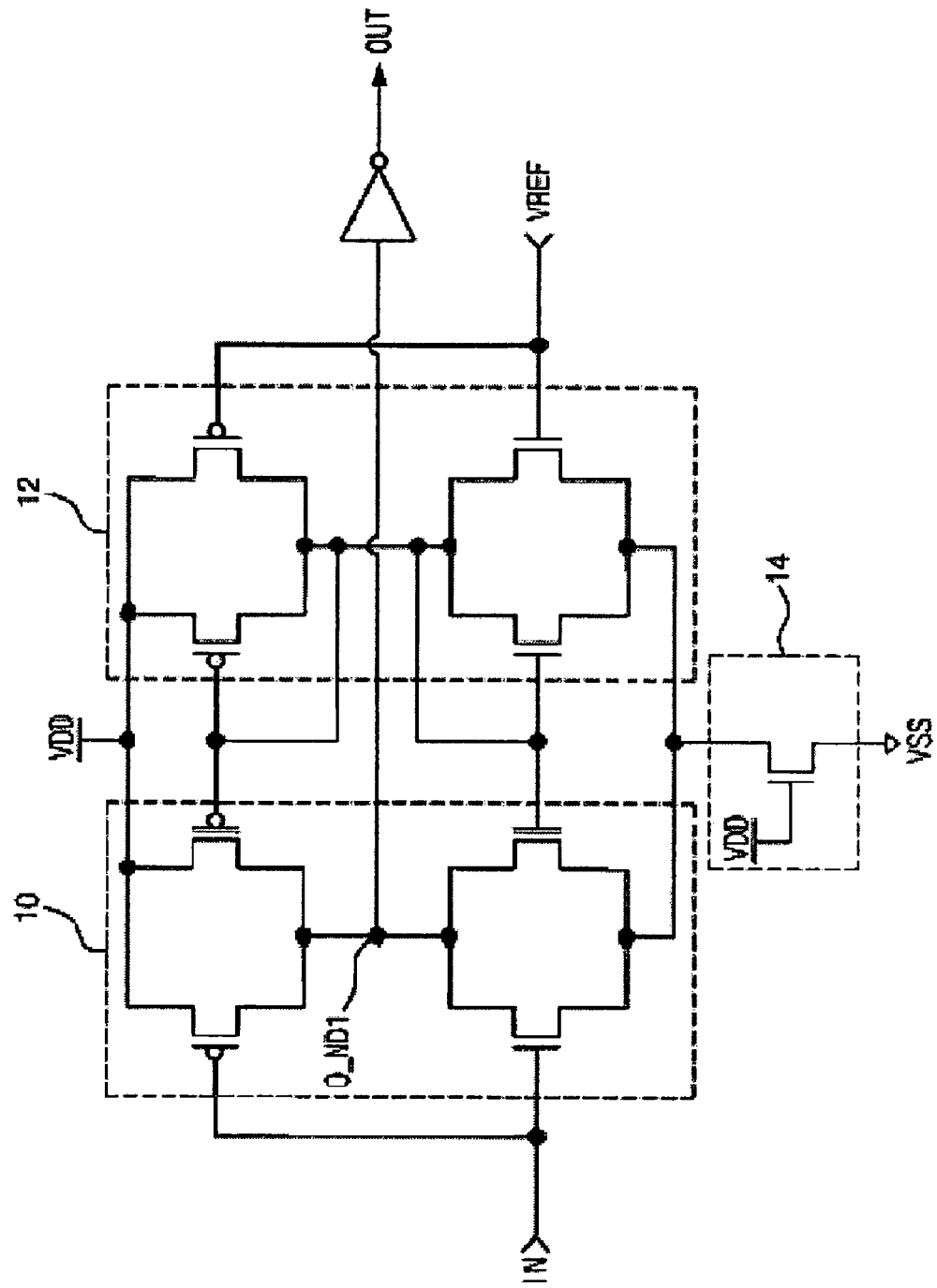
FIG. 1 is a circuit diagram showing a conventional buffer.
Figure 2:
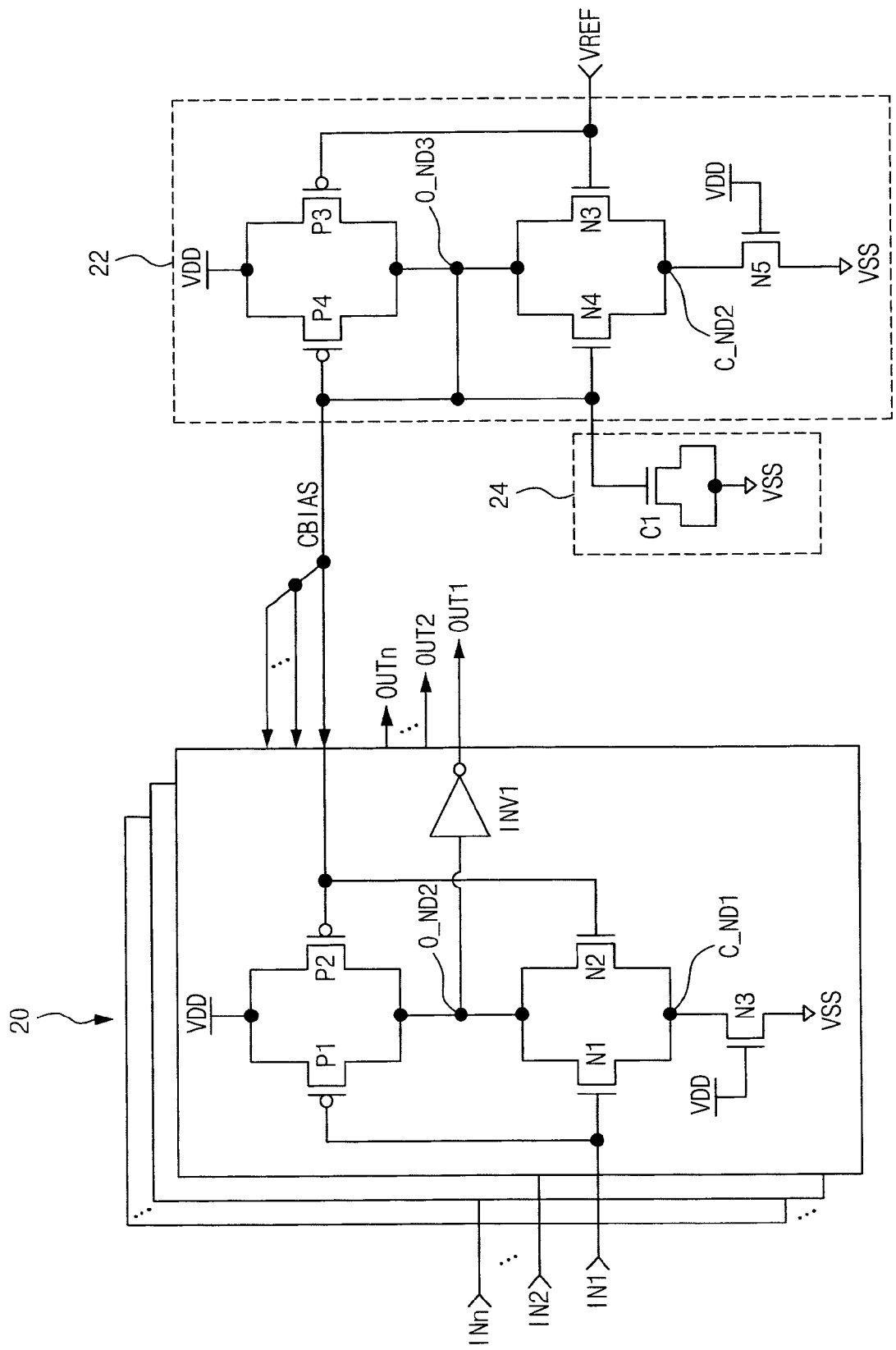
FIG. 2 is a circuit diagram showing a buffer circuit according to a first embodiment of the present invention.

Specifically, as shown in FIG. 2, the buffer circuit of the present invention comprises a plurality of interface units 20 and a common bias supply unit 22 that is shared by the interface units 20. The common bias supply unit 22 is connected to each of interface units 20 and forms a current mirror structure with the interface unit 20.

Each interface unit 20 compares an input signal IN1~INn input from each pad (not shown) with a common bias signal CBIAS and outputs an output signal OUT1~OUTn of the CMOS level corresponding to the comparison result. Herein, each of the interface units 20 is of the same structure. Hereinafter, a single interface unit 20 will be described to represent each interface unit 20 that outputs an output signal OUT1 in response to an input signal IN1.

The interface unit 20 comprises a first driving unit that performs pull-up and pull-down operation in accordance with the input signal IN1 to control the potential of the output node O_ND2; a second driving unit that performs pull-up and pull-down operation in accordance with the common bias signal CBIAS to control the potential of the output node O_ND2; a load that provides the same pull-down current in correspondence with the pull-down of the first and second driving units; and an inverter IN1 that inverts the potential of the output node O_ND2 and outputs the output signal OUT1.

The first driving unit comprises a pull-up transistor P1 that selectively pulls up the electric potential of the output node O_ND2 in accordance with a level of the input signal IN1, and a pull-down transistor N1 that selectively pulls down the potential of the output node O_ND2 in accordance with the input signal IN1. Herein, the pull-up transistor P1 is connected between the power supply voltage terminal VDD and the output node O_ND2, and is preferably a PMOS transistor having the input signal IN1 input to a gate thereof. The pull-down transistor N1 is connected between the output node O_ND2 and the common node C_ND1, and is preferably a NMOS transistor having the input signal IN1 input to a gate thereof.

The second driving unit comprises a pull-up transistor P2 that selectively pulls up the potential of the output node O_ND2 in accordance with a level of the common bias signal CBIAS, and a pull-down transistor N2 that selectively pulls down the potential of the output node O_ND2 in accordance with the level of the common bias signal CBIAS. Herein, the pull-up transistor P2 is connected between the power supply voltage terminal VDD and the output node O_ND2, and is preferably a PMOS transistor having the common bias signal CBIAS input to a gate thereof. The pull-down transistor N2 is connected between the output node O_ND2 and the common node C_ND1, and is preferably a NMOS transistor having the common bias signal CBIAS input to a gate thereof.

The load is connected between the common node C_ND1 and a ground voltage terminal VSS, and is with a NMOS transistor N3 having the power supply voltage VDD supplied to a gate thereof.

The reference voltage VREF is input to the common bias supply unit 22, and the common bias supply unit 22 generates the common bias signal CBIAS and provides the common bias signal CBIAS to each of the interface units 20. Hereinafter, the structure of the common bias supply unit 22 will be described in detail.

The common bias supply unit 22 comprises a common bias signal generating unit that performs pull-up and pull-down operations in accordance with the reference voltage VREF to generate the common bias signal CBIAS; a bias stabilizing unit that performs pull-up and pull-down operations in accordance with the common bias signal CBIAS to uniformly maintain the common bias signal CBIAS, and a load that provides the same pull-down current in correspondence with the pull-down of the bias signal generating unit and the bias stabilizing unit.

Specifically, the common bias signal generating unit comprises a pull-up transistor P3 that selectively pulls up the potential of an output node O_ND3 in accordance with the level of the reference voltage VREF, and a pull-down transistor N3 that selectively pulls down the potential of the output node O_ND3 in accordance with the level of the reference voltage VREF. Herein, the pull-up transistor P3 is connected between the power supply voltage terminal VDD and the output node O_ND3, and is preferably a PMOS transistor having the reference voltage VREF supplied to a gate thereof. The pull-down transistor N3 is connected between the output node O_ND3 and the common node C_ND2, and is preferably a NMOS transistor having the reference voltage VREF supplied to a gate thereof.

The bias stabilizing unit comprises a pull-up transistor P4 that selectively pulls up the potential of the output node O_ND3 in accordance with the common bias signal CBIAS, and a pull-down transistor N4 which selectively pulls down the potential of the output node O_ND3 in accordance with the common bias signal CBIAS. Herein, the pull-up transistor P4 is connected between the power supply voltage terminal VDD and the output node O_ND3, and is preferably a PMOS transistor having the common bias signal CBIAS input to a gate thereof. The pull-down transistor N4 is connected between the output node O_ND3 and the common node C_ND2, and is preferably a NMOS transistor having the common bias signal CBIAS supplied to a gate thereof.

The load is connected between the common node C_ND2 and the ground voltage terminal VSS, and preferably a NMOS transistor N5 is used with the power supply voltage VDD being supplied to a gate thereof.

In the buffer circuit according to an embodiment of present invention having the structure described above, the input signal IN1 has a level higher than the level of the common bias signal CBIAS when the input signal IN1 is input at a level higher than the level of the reference voltage VREF. As such, the output node O_ND2 descends to a low level. The inverter then inverts the potential of the output node O_ND2, and an output signal OUT1 of a high level is output by the inverter INV1.

The level of the input signal IN1 is lower than the common bias signal CBIAS when the input signal IN1 is input at a level lower than the level of the reference voltage VREF. As such, the output node O_ND2 ascends to a high level. The inverter then inverts the potential of the output node O_ND2, and the output signal OUT1 of a low level is output by the inverter INV1.

Similarly, the other interface units 20, to which the input signals IN2~INn are input respectively, may output the output signals OUT2~OUTn of the CMOS level using the common bias signal CBIAS in the same manner described above.

As such, the buffer circuit according to one embodiment of the present invention is structured such that the interface units 20, each have the same structure and each corresponding to one of the plurality of pads, may share one common bias supply unit 22. That is, if the level of the reference voltage VREF is equal for the input signals IN1~INn, the interface units 20, which receive the input signals IN1~INn and output the output signals OUT1~OUTn, preferably have the same properties, and such interface units 20 share one common bias supply unit 22 so that each of the interface units 20 form a current mirror-type differential amplifying circuit with the common bias supply unit 22.

Therefore, if 'n' buffers having the same properties are needed, only one common bias supply unit 22 is connected to each of the 'n' interface units 20. As a result, the number of the common bias supply units 22 is considerably reduced when compared to the prior art, thereby reducing the area occupied by the buffers within the semiconductor memory device.

Further, when the interface units 20 share the common bias supply unit 22, the number of circuits used to control each buffer, such as the reference voltage generating circuit, is considerably reduced, thereby reducing the size of the semiconductor memory chip.

Meanwhile, the buffer circuit according to an embodiment of the present invention further comprises a noise protecting unit 24 that protects the buffer circuit from any noise occurring in the reference voltage VREF.

Herein, the noise protecting unit 24 comprises a capacitor C1 that is connected between the output node O_ND3 of the common bias supply unit 22 and the ground voltage terminal VSS. The capacitor C1 is preferably a NMOS transistor-type capacitor having a gate connected to the output node O_ND3, and a source and a drain commonly connected to the ground voltage terminal VSS.

The noise protecting unit 24 having the capacitor C1 is connected between the output node O_ND3 and the ground voltage VSS to protect the buffer circuit from noise caused by the reference voltage VREF. That is, if an AC noise occurs in the reference voltage VREF, then the AC noise could also occur in the output node O_ND3. Therefore, the AC noise is removed by sending the AC noise to the ground voltage terminal VSS via the capacitor C1, and as such the noise does not influence the common bias signal CBIAS.

A buffer circuit according to another embodiment of the present invention further comprises a bias control unit in addition to the structure of FIG. 2. The buffer circuit according to the present embodiment controls the level of the common bias signal CBIAS by controlling at least one of the pull-up and pull-down strength of the common bias supply unit 22. Herein, the bias control unit comprises at least one of a sub-pull-up driver that controls the pull-up strength of the common bias supply unit in addition to the pull-up of the common bias supply unit 22, and a sub-pull-down driver, that controls the pull-down strength of the common bias supply unit 22 in addition to the pull-down of the common bias supply unit 22.

Figure 3:
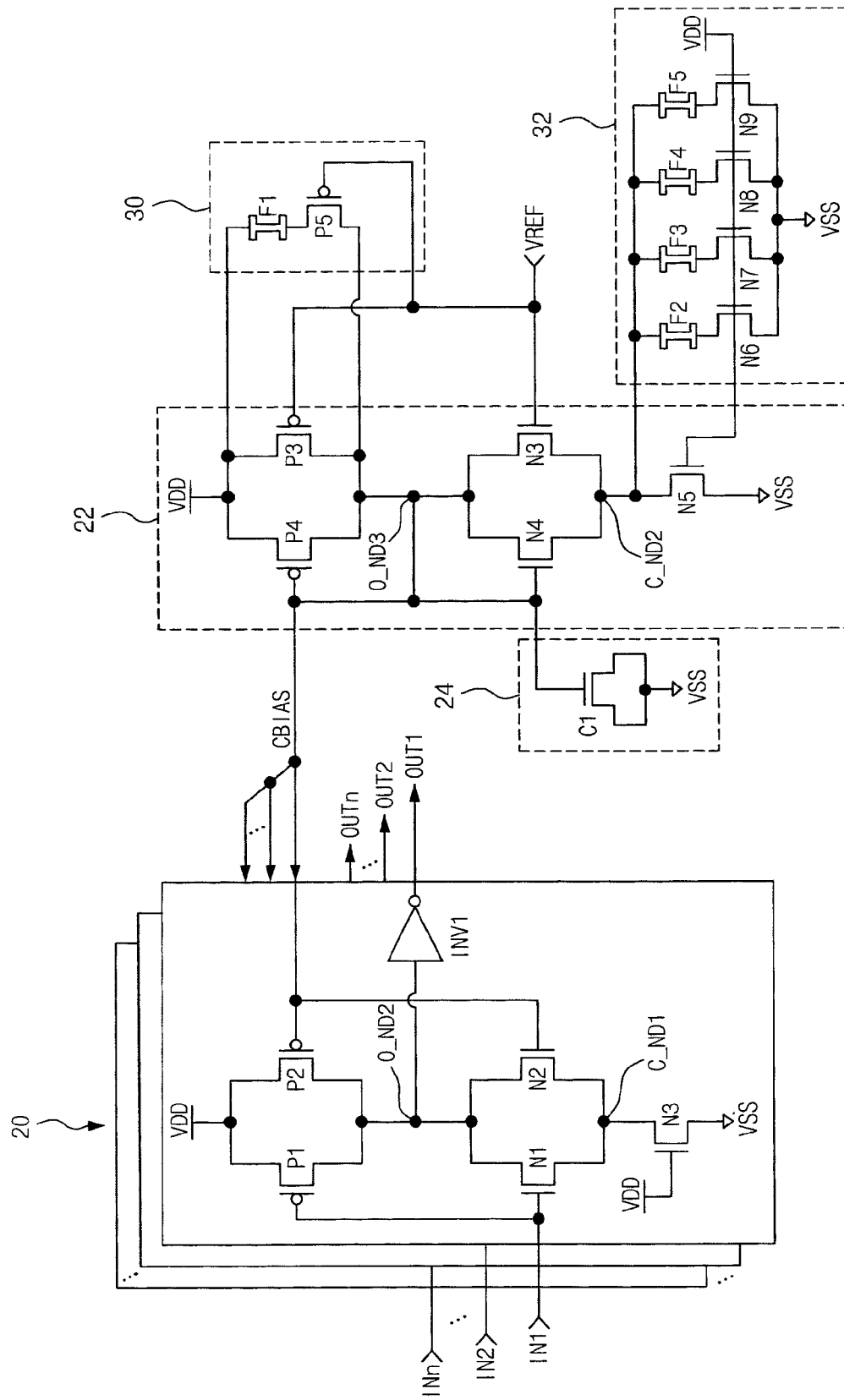
FIG. 3 is a circuit diagram showing a buffer circuit according to a second embodiment of the present invention.

Referring to FIG. 3, the bias control unit comprises a sub-pull-up driver 30 that selectively performs the sub-pull-up operation depending on whether the fuse F1 is cut or not, and a sub-pull-down driver 32 that selectively performs the sub-pull-down operation depending on whether the fuse F2 is cut or not.

The sub-pull-up driver 30 comprises a fuse F1 connected between the power supply voltage terminal VDD and the sub-pull-up transistor P5. The sub-pull-up transistor P5 selectively pulls up the output node O_ND3 in accordance with whether or not the fuse F1 is cut. The sub-pull-up transistor is preferably a PMOS transistor having the reference voltage VREF supplied to a gate thereof. Herein, two or more of the fuse F1 and the sub-pull-up transistor P5 can be provided in parallel. If two or more are sub-pull-up transistors are provided, the sub-pull-up transistors preferably have a different size different.

The sub-pull-down driver 32 comprises a fuse F2 that is connected between the common node C_ND2 and a sub-pull-down transistor N6. The sub-pull-down transistor N6 selectively pulls down the common node C_ND2 in accordance with whether or not the fuse F2 is cut. The sub-pull-down transistor N6 is connected between the fuse F2 and the ground voltage terminal VSS, and is preferably a PMOS transistor having the power supply voltage VDD supplied to a gate thereof. Herein, two or more of the fuses F3~F5 and the sub-pull-down transistors N7~N9 can be provided in parallel. If two or more are provided, the pull-down transistors preferably have different sizes.

Figure 4:
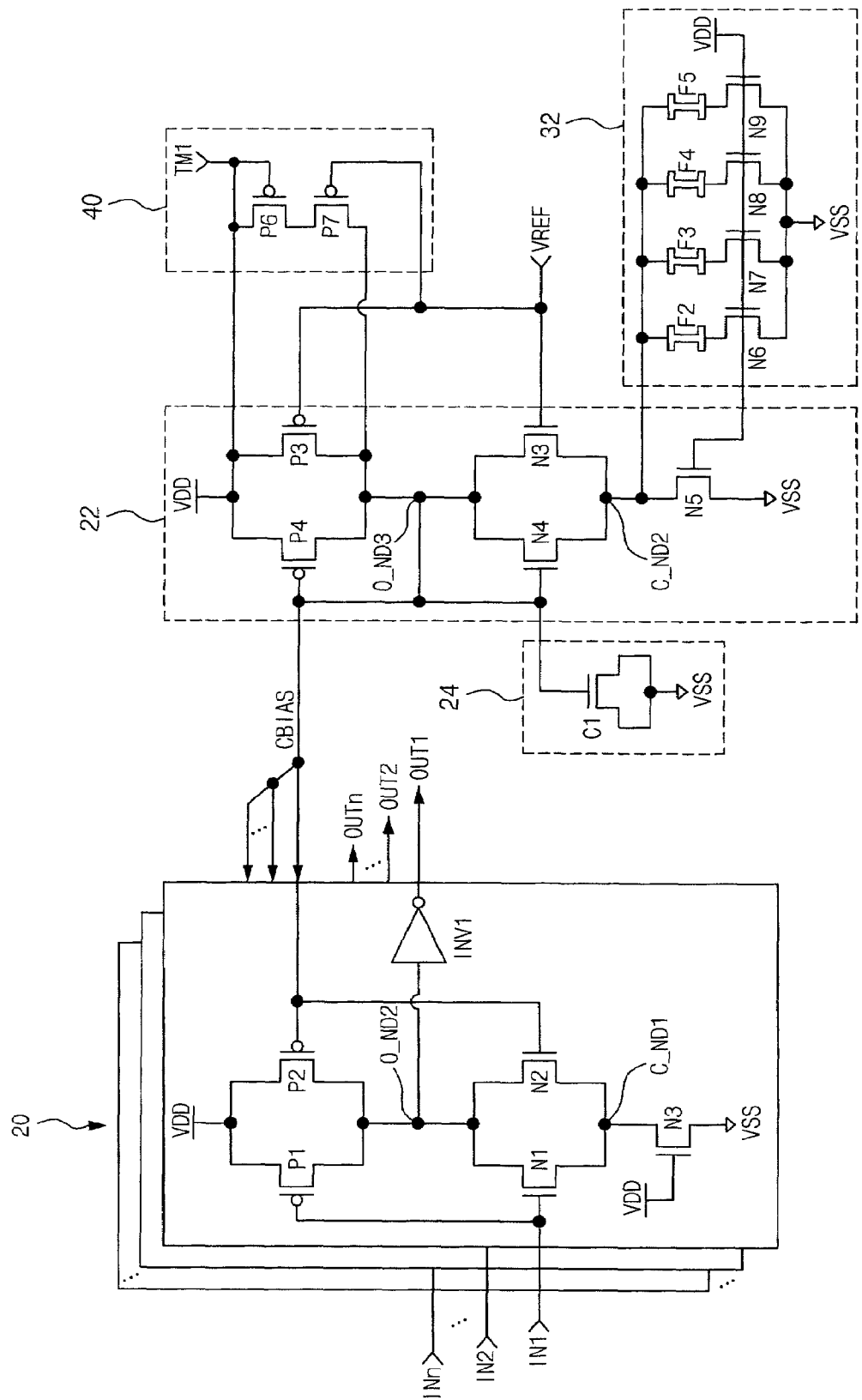
FIG. 4 is a circuit diagram showing a buffer circuit according to a third embodiment of the present invention.

Referring to FIG. 4, in another embodiment of the present invention, the bias control unit comprises a sub-pull-up driver 40 that selectively performs the sub-pull-up operation in accordance with the state of a test signal TM1 that is input when in a test mode, and a sub-pull-down driver 32 that selectively performs a sub-pull-down operation in accordance with whether or not the fuse F2 is cut. Herein, the test signal TM1 is a test mode item signal that occurs when a test mode is entered into. The test signal TM1 is used when intending to increase the level of the common bias signal CBIAS of the buffer.

The sub-pull-up driver 40 comprises a switch P6 that switches the connection between the power supply voltage terminal VDD and the output node O_ND3 in accordance with a stage of the test signal TM1; and a sub-pull-up transistor P7 that selectively pulls up the output node O_ND3 in accordance with whether or not the connection of the switch P6 is switched.

Herein, the switch P6 is connected between the power supply voltage terminal VDD and the output node O_ND3, and preferably is a PMOS transistor having the test signal TM1 input to a gate thereof, and the sub-pull-up transistor P7 is connected between the switch P6 and the output node O_ND3, and preferably is a PMOS transistor having the reference voltage VREF supplied to a gate thereof. Also, two or more of the switch P6 and the sub-pull-up transistor P7 can be provided in parallel. If two or more of the switch P6 and the sub-pull-up transistor P7 are provided in parallel, the sub-pull-up transistors preferably have different sizes.

Figure 5:
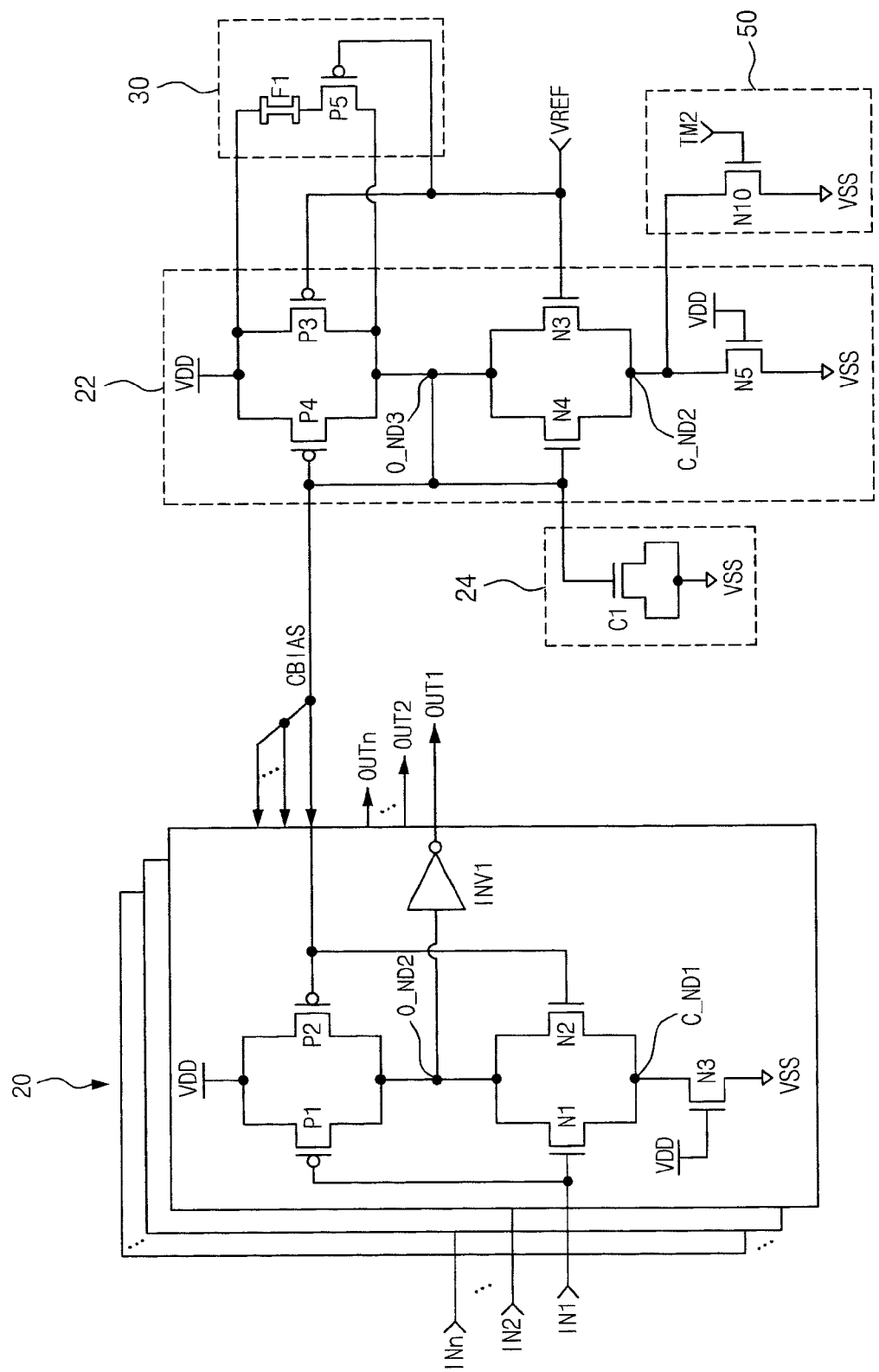
FIG. 5 is a circuit diagram showing a buffer circuit according to a fourth embodiment of the present invention.
Figure 6:
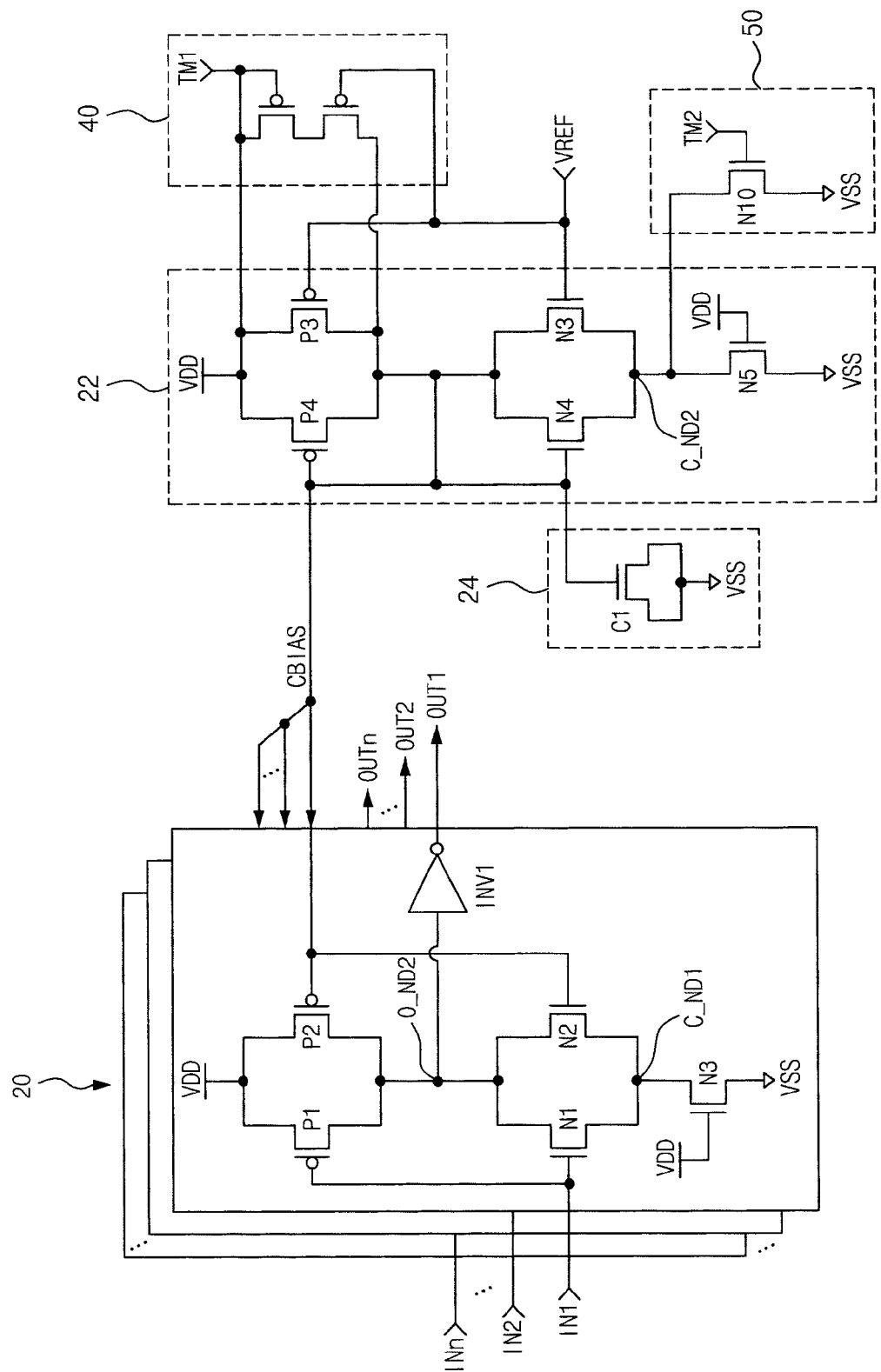
FIG. 6 is a circuit diagram showing a buffer circuit according to a fifth embodiment of the present invention.

Referring to FIG. 5, in another example of an embodiment of the present invention, the bias control unit comprises a sub-pull-up driver 30 that selectively performs a sub-pull-up operation in accordance with whether or not the fuse F1 is cut, and a sub-pull-down driver 50 that selectively performs a sub-pull-down operation in accordance with the state of a test signal TM2 that is input when the device is in a test mode. Herein, the test signal TM2 is a test mode item signal that occurring when the device enters into a test mode. The device is placed in test mode when intending to reduce the level of the common bias signal CBIAS.

The sub-pull-down driver 50 includes a sub-pull-down transistor N10 that selectively pulls down the common node C_ND2 in accordance with the state of the test signal TM2. The sub-pull-down transistor N10 is connected between the common node C_ND2 and the ground voltage terminal VSS, and is preferably a NMOS transistor having the test signal TM2 input to a gate thereof. Herein, two or more of the sub-pull-down transistors N10 can be provided in parallel. If two or more of the sub-pull-down transistors N10 are provided, the sub-pull-down transistors preferably have different sizes.

Referring to FIG. 5, in still other example according to an embodiment of the present invention, the bias control unit comprises a sub-pull-up driver 40 which selectively performs a sub-pull-up operation in accordance with the state of a test signal TM1 that is input when the device is in the test mode, and a sub-pull-down driver 50 that selectively performs a sub-pull-down operation in accordance with the state of a test signal TM2 that is input when the device is in the test mode.

When using the various structures of the buffer circuit according to the embodiments of the present invention as shown in FIG. 3 to FIG. 6, it is possible to control the level of the common bias signal CBIAS by controlling the pull-up and pull-down strength of the common bias supply unit 22 via the bias control unit.

For example in FIG. 3, when intending to increase the level of the common bias signal CBIAS, the sub-pull-up transistor P5 is driven by cutting the fuse F1 so that the level of the common bias signal CBIAS can be increased. Additionally, a sub-pull-up transistor can be driven by an enabled test signal TM1 so that the level of the common bias signal CBIAS can be increased.

As such, since the buffer circuit according to embodiments of the present invention can control the level of the common bias signal CBIAS and thus the level of each output signal OUT1~OUTn, it is possible to easily change the output properties of the interface units 20 sharing one common bias supply unit 22.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A buffer circuit, comprising:
a plurality of interface units each having a differential amplifying structure and each receiving an input signal from a corresponding input pad of a plurality of input pads, wherein each interface unit compares the respective input signal with a common bias signal that is common for each of the interface units, and wherein each interface unit outputs an output signal corresponding to the comparison result; and
a common bias supply unit which is driven by a reference voltage to provide the common bias signal to each of the interface units, wherein the input signal is lower than the common bias signal when the input signal is lower than the reference voltage, and the input signal is higher than the common bias signal when the input signal is higher than the reference voltage.

2. The buffer circuit as set forth in claim 1, wherein each interface unit forms a current mirror with the common bias supply unit.

3. The buffer as set forth in claim 1, wherein the common bias supply unit comprises:
a bias signal generating unit which performs a pull-up operation of the common bias signal and a pull-down operation of the common bias signal according to a level of the reference voltage to generate the common bias signal; and
a bias stabilizing unit which performs the pull-up operation of the common bias signal and the pull-down operation of the common bias signal according to a level of the common bias signal to allow the common bias signal to remain in a uniform state.

4. The buffer circuit as set forth in claim 3, wherein the bias signal generating unit comprises:
a pull-up transistor which selectively pulls up the common bias signal in accordance with the level of the reference voltage; and
a pull-down transistor which selectively pulls down the common bias signal in accordance with the level of the reference voltage.

5. The buffer circuit as set forth in claim 3, wherein the bias stabilizing unit comprises:
a pull-up transistor which selectively pulls up the common bias signal in accordance with the level of the common bias signal; and
a pull-down transistor which selectively pulls down the common bias signal in accordance with the level of the common bias signal.

6. The buffer circuit as set forth in claim 3, wherein the common bias supply unit further comprises a load providing a same pull-down current for the pull-down operation of the bias signal generating unit and the pull-down operation of the bias stabilizing unit.

7. The buffer circuit as set forth in claim 3, wherein the common bias supply unit further comprises a capacitor which is connected between a node to which the common bias signal is output and a ground terminal, the capacitor protecting the buffer circuit from a noise occurring in the reference voltage.

8. The buffer circuit as set forth in claim 3, wherein the common bias supply unit further comprises a bias control unit which controls a strength of at least one of the pull-up operation and the pull-down operation to control the level of the common bias signal.

9. The buffer circuit as set forth in claim 8, wherein the bias control unit comprises at least one of:
a sub-pull-up driver which controls the pull-up strength of the pull-up operation; and
a sub-pull-down driver which controls the pull-down strength of the pull-down operation.

10. The buffer circuit as set forth in claim 9, wherein the sub-pull-up driver comprises a fuse, and the sub-pull-up operation is selectively performed in accordance with whether or not the fuse is cut.

11. The buffer circuit as set forth in claim 9, wherein the sub-pull-up driver selectively performs the sub-pull-up operation in accordance with a test signal that is input when the buffer circuit is in a test mode.

12. The buffer circuit as set forth in claim 9, wherein the sub-pull-down driver comprises a fuse, and the sub-pull-down operation is selectively performed in accordance with whether or not the fuse is cut.

13. The buffer circuit as set forth in claim 9, wherein the sub-pull-down driver selectively performs the sub-pull-down operation in accordance with a test signal that is input when the buffer circuit is in a test mode.

14. The buffer circuit as set forth in claim 1, wherein each interface unit comprises:
a first driver which performs a pull-up operation or a pull-down operation of the output signal of the interface unit according to a level of the input signal to control a level of an output signal; and
a second driver which performs the pull-up operation or the pull-down operation according to a level of the common bias signal to control the level of the output signal.

15. The buffer circuit as set forth in claim 14, wherein the first driving unit comprises:
a pull-up transistor which selectively pulls up the output signal in accordance with the level of the input signal; and
a pull-down transistor which selectively pulls down the output signal in accordance with the level of the input signal.

16. The buffer circuit as set forth in claim 14, wherein the second driving unit comprises:
a pull-up transistor which selectively pulls up the output signal in accordance with the level of the common bias signal; and
a pull-down transistor which selectively pulls down the output signal in accordance with the level of the common bias signal.

* * * * *